(12) United States Patent
Ivanov et al.

(10) Patent No.: US 6,753,690 B2
(45) Date of Patent: Jun. 22, 2004

(54) INTERFEROMETRIC SIGNAL PROCESSING APPARATUS

(75) Inventors: Eugene Nikolay Ivanov, Wembley Downs (AU); Richard Alec Woode, Shenton Park (AU); Michael Edmund Tobar, Duncraig (AU)

(73) Assignees: Poseidon Scientific Instruments Pty Ltd, Fremantle (AU); University of Western Australia, Crawley (AU)

( * ) Notice: Subject to any disclaimer, the term of this patent is extended or adjusted under 35 U.S.C. 154(b) by 0 days.

(21) Appl. No.: 10/007,470

(22) Filed: Nov. 5, 2001

(65) Prior Publication Data

US 2002/0093342 A1 Jul. 18, 2002

Related U.S. Application Data

(63) Continuation of application No. 09/203,193, filed on Nov. 30, 1998, now abandoned.

(30) Foreign Application Priority Data

Apr. 10, 2001 (AU) .............................................. PO0242

(51) Int. Cl.$^7$ .............................................. G01R 13/02
(52) U.S. Cl. .................... 324/639; 324/637; 324/76.12
(58) Field of Search ................................ 324/639, 637, 324/601, 605, 76.12, 76.39, 76.22, 76.26

(56) References Cited

U.S. PATENT DOCUMENTS

| | | | | |
|---|---|---|---|---|
| 3,622,896 A | | 11/1971 | Pircher | 329/322 |
| 4,275,348 A | * | 6/1981 | Bayer et al. | 324/615 |
| 4,387,347 A | | 6/1983 | Pierrot | 331/1 R |
| 4,758,776 A | | 7/1988 | Griffin | 324/638 |
| 4,780,667 A | * | 10/1988 | Reese, Jr. et al. | 324/76.79 |
| 4,816,767 A | * | 3/1989 | Cannon et al. | 324/601 |
| 4,881,813 A | * | 11/1989 | Koo et al. | 324/244 X |
| 4,891,649 A | * | 1/1990 | Labaar et al. | 342/203 |
| 5,032,800 A | | 7/1991 | Galani et al. | 331/1 R |
| 5,226,088 A | | 7/1993 | Winterer et al. | |
| 5,307,284 A | * | 4/1994 | Brunfeldt et al. | 364/485 |
| 5,841,322 A | * | 11/1998 | Ivanov et al. | 331/1 R |

FOREIGN PATENT DOCUMENTS

| | | |
|---|---|---|
| DE | 43 00 949 C1 | 5/1994 |
| EP | 016 674 B1 | 10/1980 |
| GB | 2 209 221 A | 5/1989 |

OTHER PUBLICATIONS

"A New Mechanism For Parametric Back–Action Effect In A Gravitational Wave Antenna With A Microwave Cavity Transducer", pp. 1737–1742, J. Phys. D: Appl. Phys., vol. 28, 1995.

* cited by examiner

Primary Examiner—Anjan K. Deb
(74) Attorney, Agent, or Firm—Clark Hill PLC

(57) ABSTRACT

An interferometric signal processing apparatus (10) producing an output signal from a first input signal (34) and a second input signal (34), the input signals (34) having substantially equal carrier frequencies, comprising a bridge (12) having a first arm (26) and a second arm (28), each arm having a first end (30) and a second end (32), the first and second input signals (34) being input to the first end (30) of the first and second arms (26, 28), respectively; a device-under-test (36) provided the first arm (26); a carrier suppressor (14) connected to the second ends (32) of the first and second arms (26, 28) to produce a carrier-suppressed signal at its output (A); an amplifier (16) arranged to amplify said carrier-suppressed signal; and a mixer (22, 24) responsive to the amplified carrier-suppressed signal and a carrier-dominated signal to produce the output signal; wherein the differential group delay between: the first end (30) of the first arm (26) and the output (A) of the carrier suppressor (14); and the first end (30) of the second arm (28) and the output (A) of the carrier suppressor (14) is less than or equal to $1000/f_o$ seconds, where $f_o$ is the time-averaged mean value of the carrier frequencies of the input signals (34).

41 Claims, 6 Drawing Sheets

INTERFEROMETRIC SIGNAL PROCESSING APPARATUS

This application is a continuation of Ser. No. 09/203,193, filed Nov. 30, 1998, now abandoned.

TECHNICAL FIELD

This invention relates to an interferometric signal processing apparatus.

BACKGROUND ART

Interferometric signal processing apparatuses use an interferometric technique to minimize the noise contributions of the signal processing elements acting on the input signals, so that finer details of the differences between the input signals can be analyzed with less limitation. Carrier suppression is used to increase the sensitivity of interferometric signal processing apparatuses.

Interferometric signal processing apparatuses have been used in two configurations.

The first configuration is described by A. L. Lance, W. D. Seal and F. Labaar at page 273 in 'Infrared and Millimeter Waves', Vol 11, 1984, published by Academic Press, Inc. The interferometer described consists of a bridge in which a delay line forms one arm of the bridge and a phase shifter and an attenuator form the other arm of the bridge. The two arms of the bridge are then combined to achieve carrier suppression. Both arms of the bridge are fed with a signal from a unit-under-test.

The interferometer described by Lance et al measures FM noise in the unit-under-test. The delay line acts to introduce a differential group delay between the signals present at the power combiner, so that if the frequency of the signal produced by the unit-under-test varies with time, the signals appearing at the power combiner will have different frequencies. The output from the power combiner will be in accordance with the phase difference between the signals.

The sensitivity of the interferometer described by Lance et al is proportional to the differential group delay created by the delay line. Consequently, a significant group delay is considered desirable.

The second configuration is described by E. Ivanov in a paper titled 'A new mechanism for paramagnetic back-action effect in a gravitational wave antenna with a microwave cavity transducer' at pages 1737–1742 in J. Phys. D: Appl. Phys, Vol 28, 1995. The interferometer described consists of a bridge in which a microwave transducer, operating as a displacement sensor for a Nb gravity-wave detector, is radiatively coupled into one arm of the bridge via a pair of microwave antennae and a circulator, and the other arm of the bridge has a phase shifter and an attenuator. The two arms of the bridge are combined to achieve carrier suppression. Both arms of the bridge are fed with a signal from a microwave signal source.

The interferometer described by Ivanov is used to increase the sensitivity of the measurements from the transducer by utilising carrier suppression. The phase shifter in the other arm of the bridge is used to ensure that the signals appearing at the power combiner are 180° out of phase to achieve carrier suppression.

Sensitivity is of primary importance in measuring displacement of the Nb gravity-wave bar. Transducers with a high Q are used to increase the sensitivity of the measurements, however such high Q transducers introduce a significant group delay into the one arm of the bridge. In turn, this results in a significant differential group delay in the bridge of the interferometer described by Ivanov, with differential group delays of 10 µs or more at 10 GHz.

The significant differential group delay in the bridge places stringent requirements on the stability of the microwave signal source used. If the frequency of the microwave signal source varies with time, the output from the power combiner will include signals which are due to noise of the source, including its PM, FM and AM noise. This can significantly limit the sensitivity of the displacement measurements.

In both of the above configurations, the device in the one arm of the bridge acts as a frequency discriminating element and alters the relative phase shift of the signal travelling through it depending on the frequency of the signal.

The sensitivity of the interferometer described by Lance et al is directly proportional to the group delay of the delay line.

Similarly, in the interferometer described by Ivanov the sensitivity of the transducer is proportional to its Q factor. Consequently the sensitivity of the transducer is proportional to the group delay of the transducer, since the group delay of the transducer is substantially equal to the Q factor of the transducer divided by the carrier frequency.

SUMMARY OF THE INVENTION

The interferometric signal processing apparatus of this invention produces an output selectively containing information about the amplitude, phase or both amplitude and phase noise produced by a device-under-test (DUT). The invention seeks increase the frequency bandwidth over which the apparatus is useable and to reduce the limitations set by the noise contributions of the signal source by minimising the differential group delay.

According to a first aspect of this invention, there is provided an interferometric signal processing apparatus producing an output signal from a first input signal and a second input signal, said input signals having substantially equal carrier frequencies, comprising:

a bridge having a first arm and a second arm, each arm having a first end and a second end, the first and second input signals being input to the first end of the first and second arms, respectively;

a device-under-test provided the first arm;

a carrier suppression means connected to the second ends of the first and second arms to produce a carrier-suppressed signal at its output;

an amplifier arranged to amplify said carrier-suppressed signal; and a mixing means responsive to the amplified carrier-suppressed signal and a carrier-dominated signal to produce the output signal;

wherein the differential group delay between:

the first end of the first arm and the output of the carrier suppression means; and the first end of the second arm and the output of the carrier suppression means is less than or equal to $1000/f_o$, seconds, where $f_o$ is the time-averaged mean value of the carrier frequencies of the input signals.

In the previous statement and throughout this specification, the term 'device-under-test' is intended to mean anything that is responsive to a signal at the carrier frequency, and may include a number of components or a circuit network.

Preferably, a delay means provided in at least one arm of the bridge to reduce the differential group delay.

Preferably, the carrier suppression means comprises a power combiner, a phase shift means and an amplitude matching means, the phase shift means and the amplitude matching means being arranged such that the power combiner produces the carrier-suppressed signal from signals input thereto.

In one arrangement, said carrier-dominated signal is a further signal produced by the power combiner.

In an alternative arrangement, said carrier-dominated signal is one of said input signals.

In a further alternative arrangement, said carrier-dominated signal is a third signal having substantially the same carrier frequency as the first and second input signals.

Preferably, said output signal is used in a control system, a feedback system or a read-out system.

Preferably, the apparatus further comprises a plurality of mixing means to produce a plurality of output signals.

By altering the phase difference between the carrier-suppressed signal and the carrier-dominated signal, it is possible to control whether the output signal corresponds to the amplitude of, the phase difference between, or both the amplitude of and the phase difference between the input signals.

For example, if the carrier-suppressed signal and the carrier-dominated signal are in phase (ie. a phase difference of 0°) when input to the mixing means, the output signal will correspond to the amplitude of the input signals. Throughout the specification, this arrangement is referred to as an 'amplitude sensitive mode'.

Further, if the carrier-suppressed signal and the carrier-dominated signal are in quadrature (ie. a phase difference of 90°) when input to the mixing means, the output signal will correspond to the phase difference between the input signals. Throughout the specification, this arrangement is referred to as a 'phase sensitive mode'.

Furthermore, if there is a phase difference of between 0° and 90° between the carrier-suppressed signal and the carrier-dominated signal when input to the mixer, the output signal will correspond to both the amplitude of and the phase difference between the input signals in proportions corresponding to the cosine and sine of the phase difference, respectively.

Advantageously, if two mixing means are utilized in the apparatus and are arranged so that one of said means is set to a phase sensitive mode and the other said means is set to an amplitude sensitive mode, the apparatus can simultaneously measure both phase and amplitude changes induced by the device-under-test. This arrangement is particularly advantageous in that the outputs of the two mixers contain all of the amplitude and phase information needed to fully characterize the properties of the device-under-test.

A further advantage of the apparatus is that it provides increased immunity to amplitude and phase noise in the signal source, nor is its sensitivity limited by the intrinsic noise of the mixers when compared with existing apparatuses.

Preferably, said apparatus has two mixing means, one arranged in an amplitude sensitive mode and the other arranged in a phase sensitive mode, to produce a pair of output signals corresponding to the amplitude and phase noise induced by the device-under-test. One or both of the output signals can then be used in a feed back control system in association with a voltage controlled attenuation means and/or a voltage controlled phase shift means to reduce one or both of the amplitude and phase noise in the device-under-test. In addition, one or both of the output signals can also be used in a further feed back control system to control operation of the phase shift means and the amplitude matching means of the carrier suppression means to maximize the carrier suppression, or to control certain characteristics of the device-under-test.

BRIEF DESCRIPTION OF THE DRAWINGS

The invention will now be described with reference to six embodiments thereof and the accompanying drawings, in which.

DESCRIPTION OF THE BEST MODE OF THE INVENTION

Figure 1:
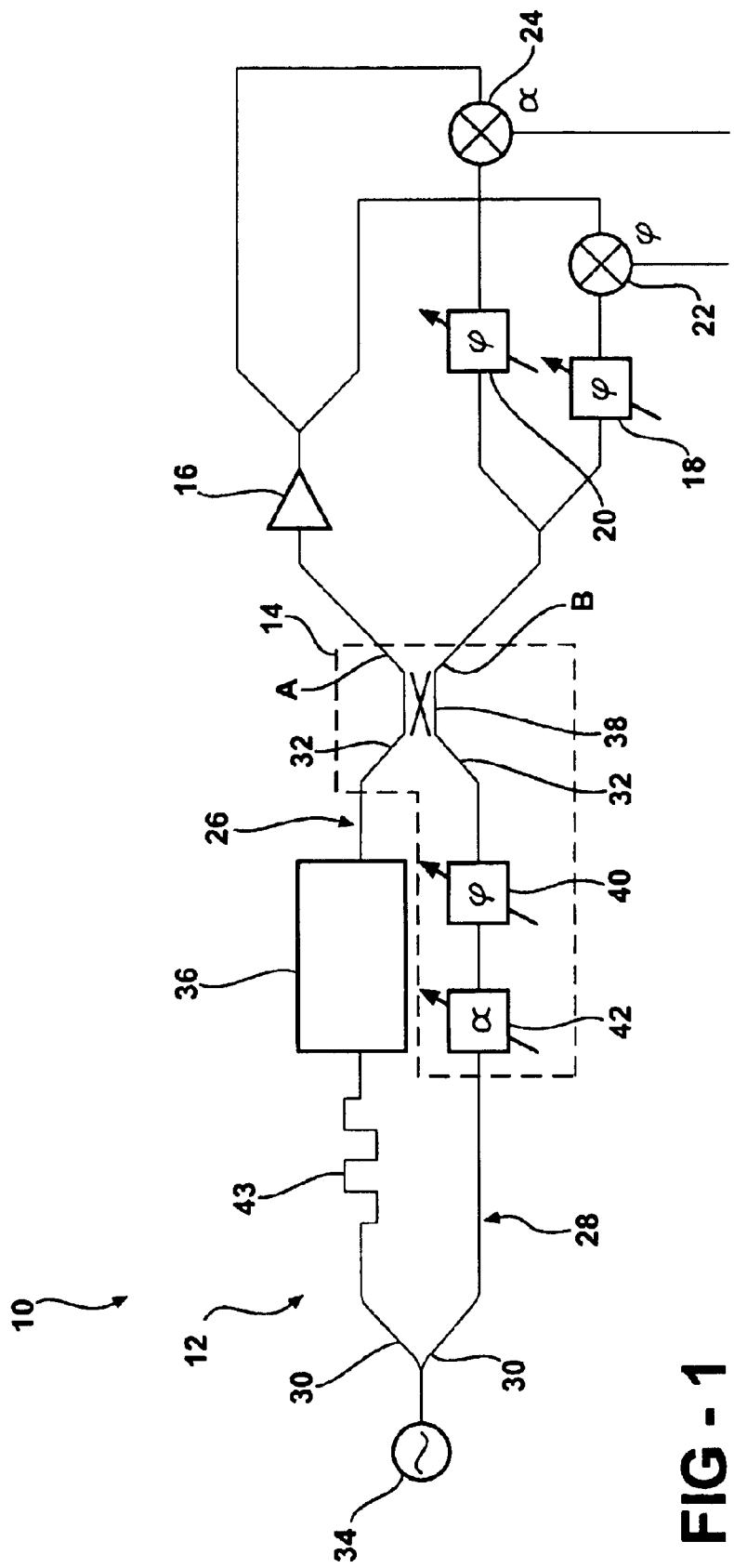
FIG. 1 shows an interferometric signal processing apparatus according to a first embodiment of the invention.

In FIG. 1 there is shown an interferometric signal processing apparatus 10 comprising a bridge 12, a carrier suppression means 14, an amplifier 16, a pair of phase shifters 18 and 20 and a pair of double balanced mixers 22 and 24.

The bridge 12 has a first arm 26 and a second arm 28, each of which has a first end 30 and a second end 32. The first end 30 of each arm 26 and 28 is connected to a signal source in the form of an oscillator 34. A DUT (device-under-test) 36 is provided in the first arm 26 of the bridge 12.

The carrier suppression means 14 comprises a power combiner 38 in the form of a 3 dB 90° hybrid, a phase shifter 40 and an attenuator 42. The phase shifter 40 and the attenuator 42 are provided in the second arm 28 of the bridge 12.

The power combiner 38 is connected to the second ends 32 of the arms 26 and 28. The phase shifter 40 and the attenuator 42 are arranged such that the power combiner 38 produces a carrier-suppressed signal at its output 'A' and a carrier-dominated signal at its output 'B'. In other embodiments, the phase shifter 40 and the attenuator 42 may be provided in the first arm 26.

The output 'A' of the power combiner 38 is connected to the input of the amplifier 16. The output of the amplifier 16 is connected to each of the mixers 22 and 24.

The output 'B' of the power combiner 38 is connected to each of the phase shifters 18 and 20. The output of the phase shifter 18 is connected to the mixer 22 and the output of the phase shifter 20 is connected to the mixer 24.

The phase shifter 18 and the mixer 22 are arranged in a phase-sensitive mode. That is, arranged such that the signals appearing at the mixer 22 are in quadrature such that the mixer 22 produces an output corresponding to the phase difference between the signals input to the power combiner 38.

The phase shifter 20 and the mixer 24 are arranged in an amplitude-sensitive mode. That is, arranged such that the signals appearing at the mixer 24 are in phase, such that the mixer 24 produces an output corresponding to the amplitude of the signals input to the power combiner 38.

To minimize the FM noise contribution from the oscillator 34 appearing at the output 'A' of the power combiner 38, the differential group delay between the first end 30 of the first arm 26 and the output 'A' of the power combiner 38, and the first end 30 of the second arm 28 and the output 'A' of the power combiner 38 is minimized. The differential group delay must be less than 100 ns, and ideally will be close to Ons. Minimising the differential group delay also increases the bandwidth of measurements that can be taken.

To achieve a minimal differential group delay, it is necessary to match the group delay from the first end 30 of the first arm 26 to the output 'A' of the power combiner 38 with the group delay from the first end 30 of the second arm 28 to the output 'A' of the power combiner 38.

In this embodiment, it is assumed that the DUT 36 has a smaller group delay than the combined group delay of the attenuator 42 and the phase shifter 40. Accordingly, a delay means 43 is provided in the first arm 26 of the bridge 12 to minimize the differential group delay. The delay means used in the embodiment is a length of cable, however it should be appreciated that other devices may be used with equal efficacy, such as transmission line, phase shifters or trombone phase shifters.

In order to achieve a minimal differential group delay, the group delay of each arm 26 and 28 is measured with a vector network analyzer and the difference calculated therefrom. Alternatively, the group delay of each arm 26 and 28 can be estimated from measured or specified device characteristics. The group delay in at least one of the arms 26 and 28 is then adjusted by adding or removing a length of transmission line of known delay per unit length. Fine tuning of the differential group delay can be achieved using a variable-delay transmission line, such as a phase shifter, a tombone phase shifter, a reactive phase shifter or a voltage controlled phase shifter.

Where the differential group delay between the arms 26 and 28 is minimal, compensation for this group delay may be achieved using the phase shifter 40. Where the differential group delay is larger, a delay means must be inserted into one of the arms 26 or 28.

Figure 2:
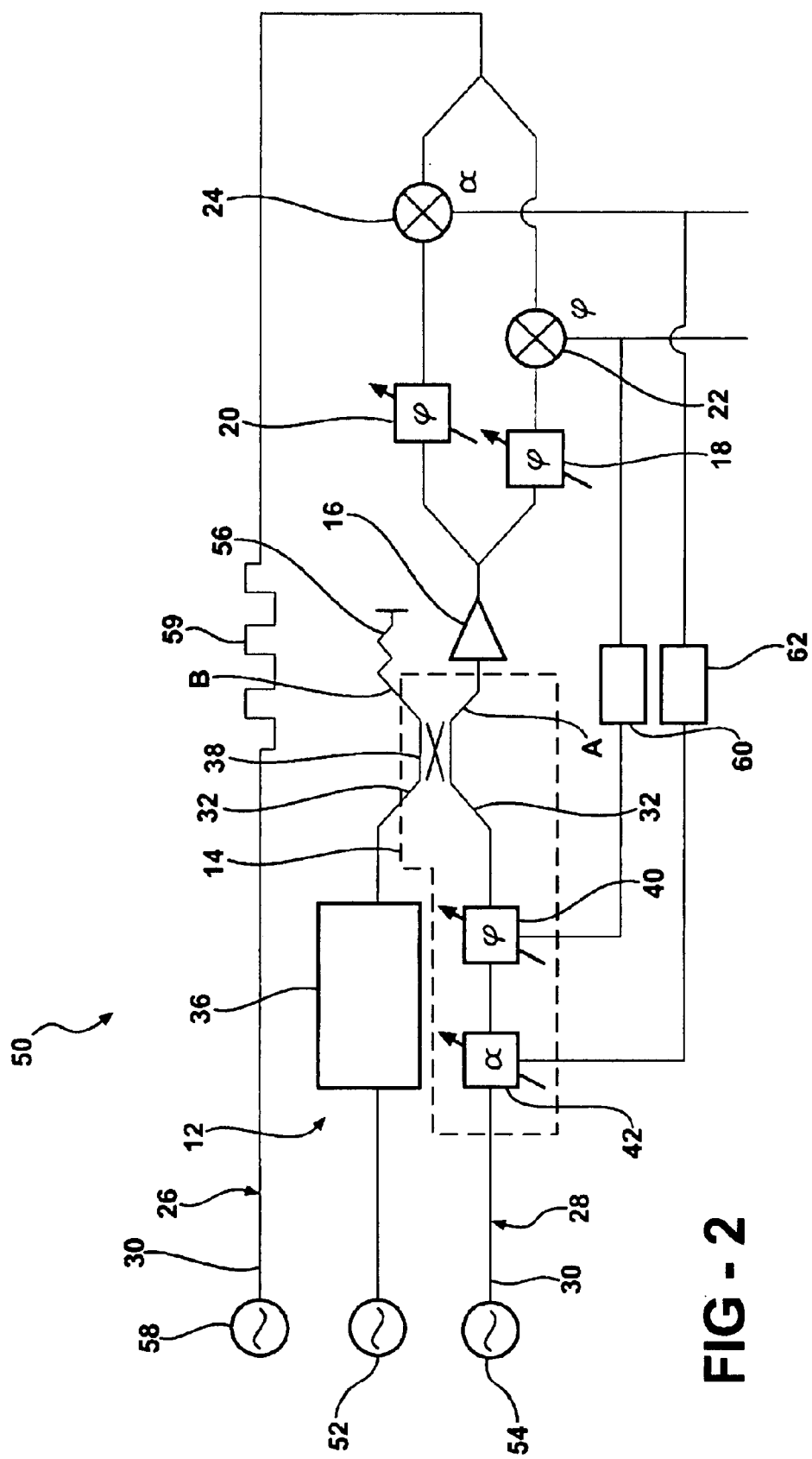
FIG. 2 shows an interferometric signal processing apparatus according to a second embodiment of the invention.

A second embodiment of the invention is shown in FIG. 2. The second embodiment is directed towards an interferometric signal processing apparatus 50, with like reference numerals to denoting like past to those described in the first embodiment.

The second embodiment differs from the first embodiment in that the first end 30 of the first arm 36 is connected to a first signal source 52 and the first end 30 of the second arm 28 is connected to a second signal source 54. Further, in this embodiment it is assumed that the phase shifter 40 can compensate for the differential group delay. It should be appreciated that a delay means can be inserted into the bridge 12 if the differential group delay so required.

In addition, the output 'B' of the power combiner 38 is terminated using a matching impedance 56. A carrier-dominated signal is provided to the mixers 22 and 24 from a third signal source 58. A delay means 59 is provided between the third signal source and the mixers 22 and 24. The delay means 59 is arranged such that there is a minimal group delay between the signals input to the mixers 22 and 24.

The first signal source 52, the second signal source 54 and third signal source 58 all have substantially equal carrier frequencies.

The phase-sensitive output produced by the mixer 22 is input to a filter 60, the output of which is connected to the phase shifter 40 to control operation thereof. Similarly, the amplitude-sensitive output produced by the mixer 24 is connected to a filter 62, the output of which is connected to the attenuator 42.

By utilising a feed back control system in the form of the filters 60 and 62, operation of the phase shifter 40 and the attenuator 42 are controlled such that carrier suppression achieved by the power combiner 38 is substantially maximized. A further advantage of the feedback control system is that variations in the phase and amplitude response of the DUT 36 with time, temperature, power or frequency are compensated for, ensuring carrier suppression.

The output signals from the mixers 22 and 24 can also be used to monitor the phase and amplitude noise induced by the DUT 36 or in a signal analysis or control system.

Figure 3:
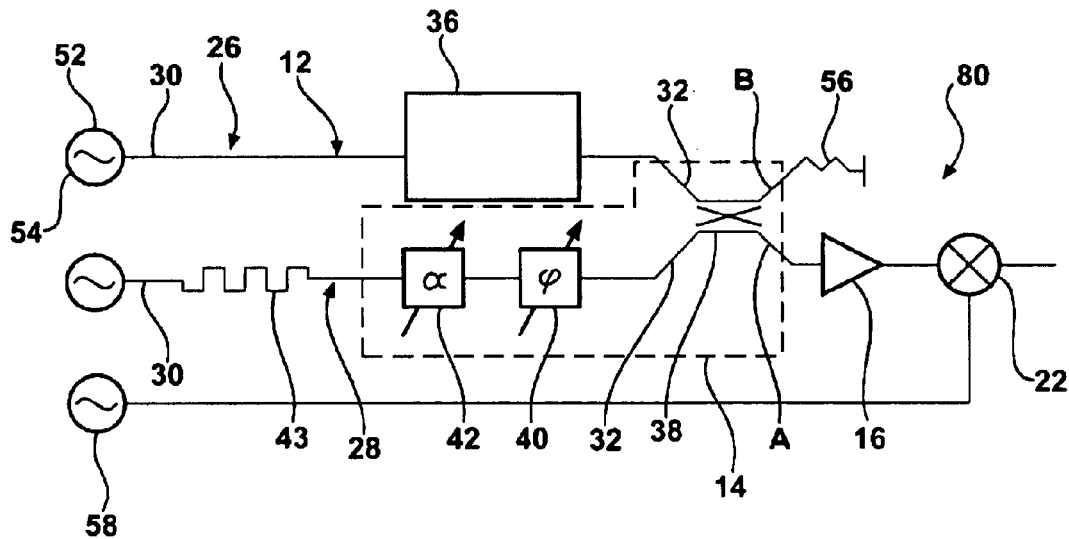
FIG. 3 shows an interferometric signal processing apparatus according to a third embodiment of the invention.

A third embodiment of the invention is shown in FIG. 3, with like reference numerals denoting like past to those described in relation to the previous embodiments. The third embodiment is similar to the second embodiment, except that the delay means 59 and the feed back controlled system is not provided. Further, in this embodiment it is assumed that the group delay in the first arm 26 is significantly greater than the group delay in the second arm 28. Accordingly, a delay means 43 is provided in the second arm of the bridge 12.

Figure 4:
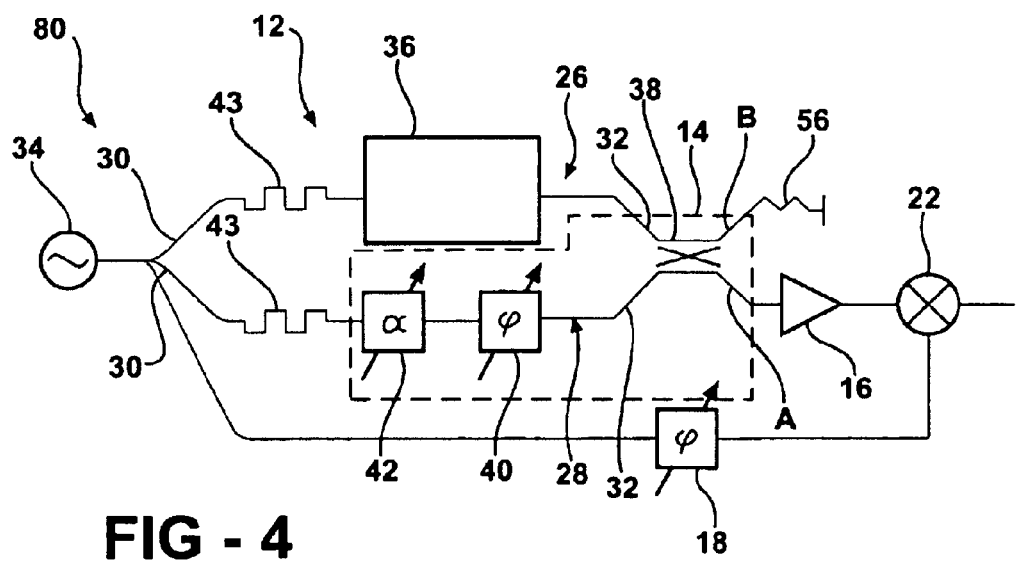
FIG. 4 shows an interferometric signal processing apparatus according to a fourth embodiment of the invention.

A fourth embodiment of the invention is shown in FIG. 4, with like reference numerals denoting like past to those described in relation to the earlier embodiments. The fourth embodiment is directed towards a interferometric signal processing apparatus 80 of a generally similar form to the first embodiment. The fourth embodiment differs from the first embodiment in that the signal source for each arm of the bridge and the mixer is the same source, and the phase shifter 20 and the mixer 24 are omitted from the interferometric signal processing apparatus 80.

Further, the output 'B' of the power combiner 38 is terminated by a matching impedance 52. The carrier-dominator signal for the mixer 22 is provided from the oscillator 34.

Still further, a delay means 43 is provided in each arm 26 and 28 of the bridge 12. In this manner, the differential group delay is minimized, and the differential group delay of the signals input to the mixer 22 is also minimized.

Figure 5:
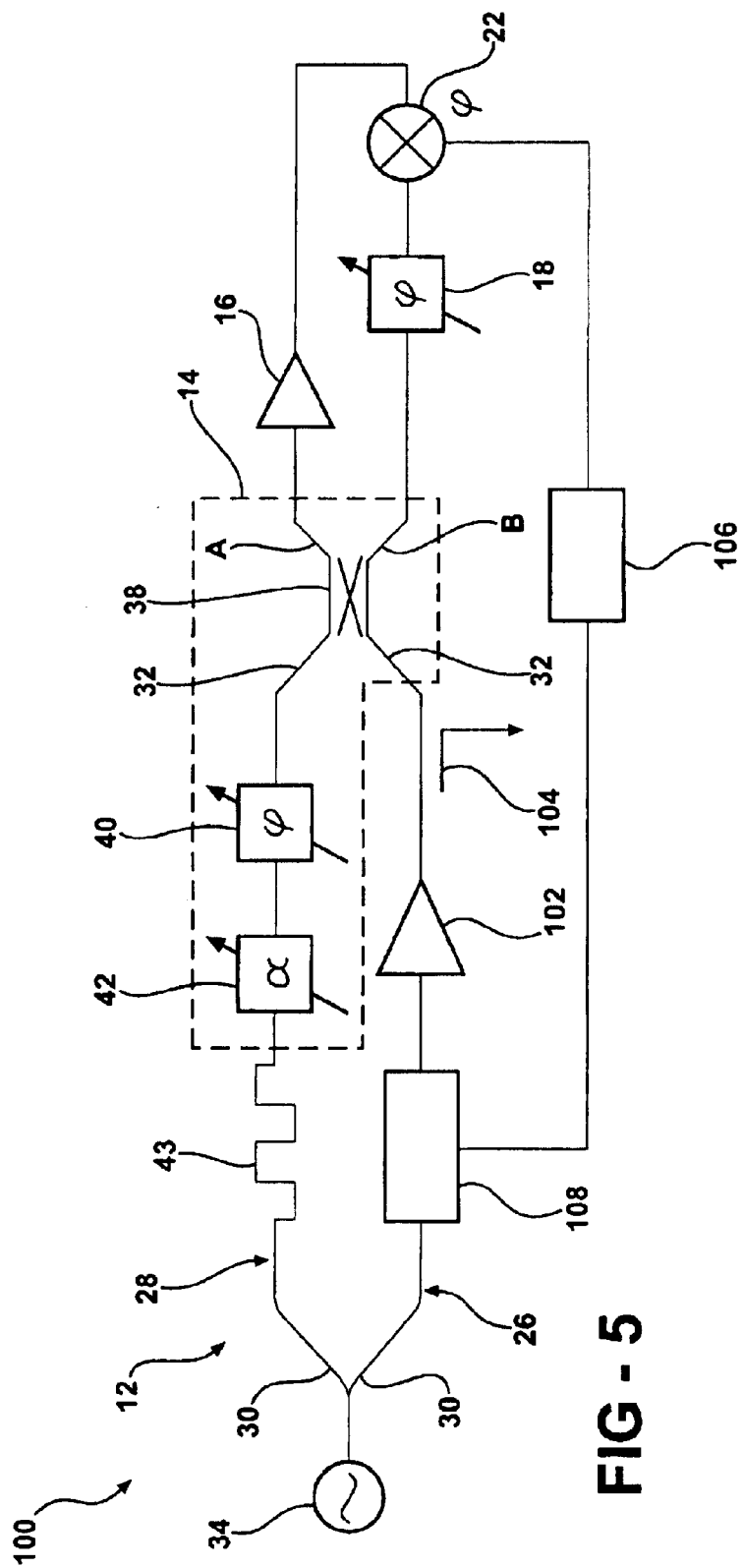
FIG. 5 shows an interferometric signal processing apparatus according to a fifth embodiment of the invention.

A fifth embodiment of the invention is shown in FIG. 5, with like reference numerals denoting like past to those described in relation to the previous embodiments.

The fifth embodiment is directed towards an interferometric signal processing apparatus 100 that is similar to the interferometer of the first embodiment, except that the phase shifter 20 and the mixer 24 in the apparatus of the first embodiment are omitted from the interferometric signal processing apparatus 100.

Further, the device-under-test in the fifth embodiment comprises an amplifier 102. A coupler 104 is provided in the first arm 26 after the amplifier 102 to couple a portion of the output of the amplifier 102 from the bridge 12.

The fifth embodiment includes a feed back control system in the form of a filter 106 and a voltage-controlled phase shifter 108. The voltage-controlled phase shifter 108 is provided in the first arm 26 before the amplifier 102.

The filter 106 is responsive to the phase-sensitive output of the mixer 22. The output of the filter 106 is connected to the voltage-controlled phase shifter 108 to control the operation thereof. The feed back system acts to substantially eliminate phase noise introduced by the amplifier 102.

Figure 6:
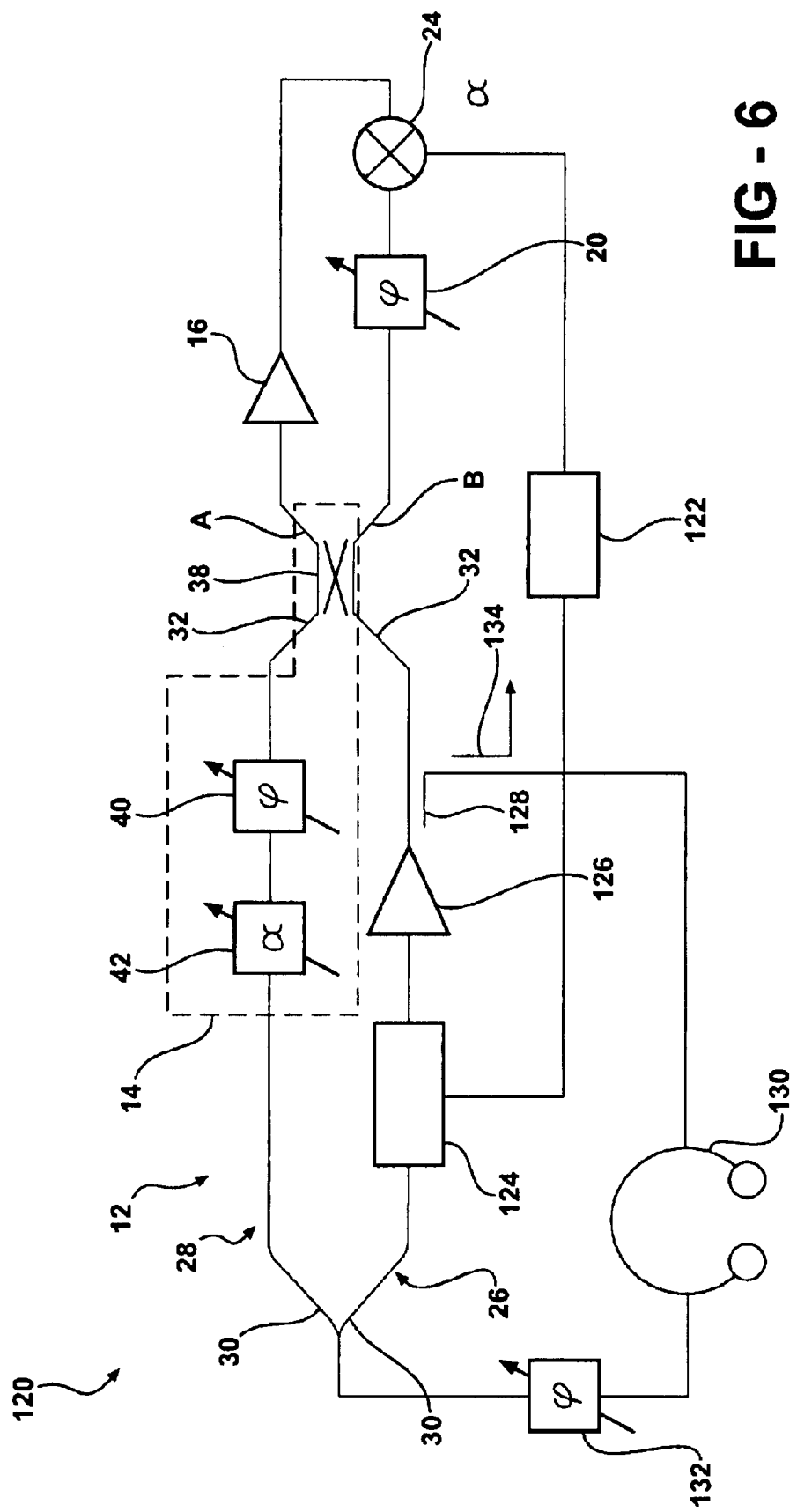
FIG. 6 shows an interferometric signal processing apparatus according to a sixth embodiment of the invention.

A sixth embodiment of this invention is shown in FIG. 6, with like reference numerals denoting like past to those described in the previous embodiments. The sixth embodiment is directed towards an interferometric signal processing apparatus 120.

The interferometric signal processing 120 includes a feed back control system comprising a filter 122 and a voltage-controlled attenuator 124. The voltage-controlled attenuator 124 is provided in the first arm 26 before an amplifier 126.

The device-under-test in the sixth embodiment is the amplifier 126, which is provided in the first arm 26 of the bridge 12.

A coupler 128 is provided in the first arm 26 after the amplifier 126 to couple a portion of the output of the amplifier 126 from the first arm 26. The output coupled by the coupler 128 is input to a resonant cavity 130, the output of which is input to a phase shifter 132. The output of the phase shifter 132 forms the signal source for the interferometric processing apparatus 120.

In effect, the resonant cavity 130, the phase shifter 132, the amplifier 126 and the coupler 128 form a loop oscillator. A further coupler 134 is provided in the loop oscillator to couple an output therefrom.

The amplitude-sensitive output from the mixer 24 is input to the filter 122, the output of which is used to control the voltage-controlled attenuator 124. In effect, the feed back controlled system in the interferometric processing apparatus 120 acts to stabilize the amplifier 126 and thereby stabilize the amplitude of the output of the loop oscillator.

Figure 7:
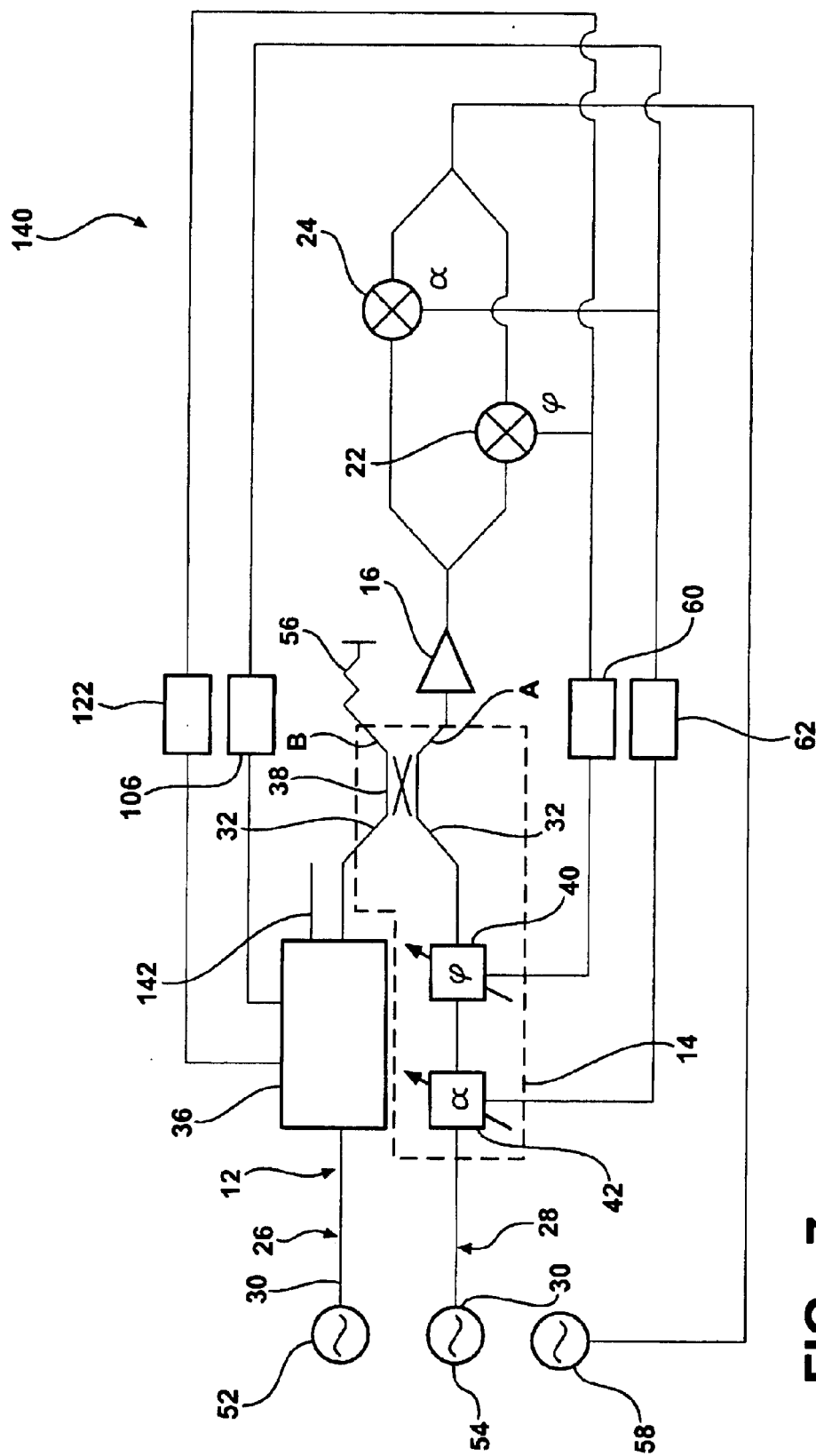
FIG. 7 shows an interferometric signal processing apparatus according to a seventh embodiment of the invention.

A seventh embodiment of this invention is shown in FIG. 7, with like reference numerals denoting like past to those described in the previous embodiments. The seventh embodiment is directed towards an interferometric signal processing apparatus 140.

The apparatus 140 is similar to the apparatus 50 of the second embodiment, except that the delay means 59 is not provided. In addition, the DUT 36 in the apparatus 140 includes a second output 142

The apparatus 140 includes a first feed back control system in the form of filters 60 and 62 as described in relation to the second embodiment.

The apparatus 140 further includes a second feed back control system in the form of filters 106 and 122. The filters 106 and 122 are responsive to the outputs of the mixers 22 and 24, respectively. The outputs of the filters 106 and 122 are input to the DUT 36 to control operation thereof.

The filters 60 and 62 act to maximize the carrier suppression, whilst the filters 106 and 122 act to compensate for phase and amplitude noise in the DUT 36. It should be appreciated that in some circumstances, the frequency ranges filtered by the filters 60 and 62 and the filters 106 and 122 should not overlap to avoid the first and second feed back control systems from competing.

It should be appreciated that the present invention is not limited to the particular embodiments described above.

What is claimed is:

1. An interferometric signal processing apparatus for producing an output signal indicative of a characteristic of a device-under-test from a first input signal, a second input signal and a carrier-dominated input signal having substantially equal carrier frequencies, said interferometric signal processing apparatus comprising:

a bridge having a first arm and a second arm, each of said first and second arms including first ends and second ends, said first and second arms receiving the first and second input signals at said first ends, respectively, the device-under-test being connected to said first arm between said first and second ends thereof:

a carrier suppressor connected to said second ends of said first arm and said second arm, in conjunction with said second arm, and having an output for transmitting a carrier-suppressed signal, said carrier-suppressed signal including the characteristic of the device-under-test;

an amplifier electrically connected to said output of said carrier suppressor for amplifying said carrier-suppressed signal to produce an amplified carrier-suppressed signal;

a mixer having a first mixer input for receiving said amplified carrier-suppressed signal and a second mixer input for receiving said carrier-dominated input signal to produce the output signal indicative of the characteristic of the device-under-test at an output thereof; and a delay provided in one of said first arm and said second arm to minimize a differential group delay between said first and second arms to a value not greater than $1000/f_o$ seconds, wherein $f_o$ is a time-averaged mean value of the carrier frequencies of the first input signal and second input signal, measured in Hertz.

2. An interferometric signal processing apparatus as set forth in claim 1 wherein said carrier suppressor includes a power combiner electrically connected to said first and second arms for producing said carrier-suppressed signal.

3. An interferometric signal processing apparatus as set force in claim 1 wherein said carrier suppressor also includes a phase shifter electrically connected to second arm between said first and second ends.

4. An interferometric signal processing apparatus as set forth in claim 3 wherein said carrier suppressor further includes an attenuator electrically connected to said second arm between said first and second ends and in series with said phase shifter.

5. An interferometric signal processing apparatus as set forth in claim 1, wherein said first input signal and said second input signal are directly sourced from the same signal source.

6. An interferometric signal processing apparatus as set forth in claim 5, wherein the carrier-dominated input signal is also sourced from said same signal source.

7. An interferometric signal processing apparatus as set forth in claim 1, wherein said carrier suppressor also transmits the carrier-dominated input signal.

8. An interferometric signal processing apparatus as set forth in claim 7 wherein said carrier suppressor includes a power combiner electrically connected to said first and second arms for producing said carrier-suppressed signal and the carrier-dominated input signal, said power combiner having first and second outputs for transmitting said carrier-suppressed signal and the carrier-dominated input signal, respectively.

9. An interferometric signal processing apparatus as set forth in claim 1, wherein a carrier-dominated signal phase shifter is electrically connected to said second mixer input and is arranged in a phase-sensitive mode with said mixer so that the carrier-dominated input signal is in quadrature with said carrier-suppressed signal to produce an output signal at said output corresponding to the phase difference between the signals input to said carrier suppressor.

10. An interferometric signal processing apparatus as set forth in claim 9, including a feedback control system connected between said output and the input to said deviceunder-test to eliminate noise introduced by the device-under-test, wherein said feedback control system comprises a filter responsive to the phase-sensitive output of said mixer and a voltage controlled phase shiftier connected in said first arm between said first end and the input to said device-under-test, whereby the output of said filter is connected to said voltage controlled phase shifter to control the operation thereof in a manner so as to substantially eliminate phase noise introduced by said device-under-test.

11. Am interferometric signal processing apparatus as set forth in claim 10, wherein said device-under-test is an amplifier and a coupler is connected to the output thereof in said first arm to couple a portion of the output of the amplifier from said bridge.

12. An interferometric signal processing apparatus as set forth in claim 1, wherein a carrier-dominated signal phase shifter is electrically connected to said second mixer input and is arranged in an amplitude-sensitive mode with said mixer so that the carrier-dominated input signal is in phase with said carrier-suppressed signal to produce an output signal at said output corresponding to the amplitude difference between the signals input to said carrier suppressor.

13. An interferometric signal processing apparatus as set forth in claim 12, including a feedback control system connected between said output and the input to said device-under-test to eliminate noise introduced by the device-under-test, wherein said feedback control system comprises a filter responsive to the attplitude-sensitive output of said mixer and either a voltage controlled attenuator connected in said first arm between said first end and the input to said device-under-test, whereby the output of said filter is connected to said voltage controlled attenuator to control the operation thereof in a manner so as to reduce the amplitude noise of said device-under-test.

14. An interferometric signal processing apparatus as set forth in claim 1, wherein said mixer includes first and second double balanced mixers each having a carrier-dominated signal phase shifter electrically connected to said second mixer input thereof, said carrier-dominated signal phase shifter of said first double balanced mixer being arranged in a phase-sensitive mode with said mixer so that the carrier-dominated input signal is in quadrature with said carrier-suppressed signal input thereto to produce an output signal at said output thereof corresponding to the phase difference between the signals input to said carrier suppressor, and said carrier-dominated signal phase shifter of said second double balanced mixer being arranged in an amplitude-sensitive mode with said mixer so that the carrier-dominated input signal is in phase with said carrier-suppressed signal input thereto to produce an output signal at said output thereof corresponding to the amplitude difference between the signals input to said carrier suppressor.

15. An interferometric signal processing apparatus as set forth in claim 16, wherein said carrier suppresser also includes a phase shifter electrically connected to said second arm between said first and second ends and an attenuator electrically connected to said second arm between said first and second ends and in series with said phase shifter, said interferometric signal processing apparatus further comprising a second feed back control system responsive to respective said output signals of said first and second double balanced mixers to control operation of said phase shifter and said attenuator to maximize carrier suppression.

16. An interferometric signal processing apparatus as set forth in claim 1, including a feedback control system connected between said output and input to the device-under-test to substantially eliminate noise introduced by the device-under-test.

17. An interferometric signal processing apparatus as set forth in claim 1, wherein a carrier-dominated signal phase shifter is electrically connected to said second mixer input and is arranged in either a phase-sensitive mode or an amplitude-sensitive mode with said mixer so that said carrier-dominated input signal is either:

(i) in quadrature with said carrier-suppressed signal to produce an output signal at said output corresponding to the phase difference between the signals input to said carrier suppressor; or (ii) in phase with said carrier-suppressed signal to produce an output signal at said output corresponding to the amplitude difference between the signals input to said carrier suppressor;

respectively, said interferometric signal processing apparatus including a feedback control system connected between said output and the input to the device-under-test to eliminate noise introduced by the device-under-test, wherein said feedback control system comprises a filter responsive to the either said phase-sensitive output or the amplitude-sensitive output of said mixer, dependent upon the arrangement of said carrier-dominated signal phase shifter, and either a voltage controlled phase shifter or a voltage controlled attenuator, respectively, connected in said first arm between said first end and the input to said device-under-test whereby the output of said filter is connected to:

(iii) in the case of said carrier-dominated signal phase shifter being arranged in a phase-sensitive mode, said voltage controlled phase shifter to control the operation thereof in a manner so as to substantially eliminate phase noise introduced by said device-under-test; or (iv) in the case of said carrier-dominated signal phase shifter being arranged in an amplitude-sensitive mode, said voltage controlled attenuator to control the operation thereof in a manner so as to reduce the amplitude noise of said device-under-test.

18. An interferometric signal processing apparatus as set forth in claim 17, wherein said device-under-test is an amplifier and a coupler is connected to the output thereof in said first arm to couple a portion of the output of the amplifier from said bridge.

19. An interferometric signal processing apparatus as set forth in claim 18, wherein a loop oscillator is connected between the output of said coupler and said first ends of said bridge to provide the input signals to said bridge.

20. An interferometric signal processing apparatus as set forth in claim 19, wherein said loop oscillator comprises: a resonant cavity connected to the output of said coupler so that said portion is input to said resonant cavity and a phase shifter connected between the output of said resonant cavity and said first ends to provide the signal source to said bridge.

21. An interferometric signal processing apparatus as set forth in claim 10, wherein a further coupler is provided in said loop oscillator to couple a portion of the output therefrom.

22. An interferometric signal processing apparatus for reducing noise of an input signal generated by a signal source when testing a device-under-test, said interferometric signal processing apparatus comprising:

a bridge having a first arm defining a first delay and a second arm defining a second delay such that said first and second delays define a differential group delay, each of said first and second arms extending between a first end and two second ends, said first arm connected to said second arm parallel thereto and said first end being electrically connected to the signal source allowing the input signal to be transmitted over said first and second arms, said first arm receiving the device-under-test in series between said first end and said second end of said first arm:

a carrier suppressor connected to said second ends of said first and second arms, in conjunction with said second arm, and having an output for transmitting a carrier-suppressed signal;

an amplifier electrically connected to said output of said carrier suppressor for amplifying said carrier-suppressed signal to produce an amplified carrier-suppressed signal; and wherein said first delay or said second delay is adjustable so that said differential group delay between said first and second arms is minimized to a value not greater than $1000/f_o$ seconds wherein $f_o$ is a time-averaged mean value of the carrier frequencies of the first and second input signals measured in Hertz.

23. An interferometric signal processing apparatus as set forth in claim 22 including a mixer electrically connected to said second ends for receiving said amplified carrier-suppressed signal and a carrier-dominated signal having substantially the same carrier frequency of said signal source to produce an output signal indicative of a characteristic of the device-under-test.

24. An interferometric signal processing apparatus as set forth in claim 23, wherein said carrier suppressor also transmits said carrier-dominated signal.

25. An interferometric signal processing apparatus as set forth in claim 23, wherein said carrier-dominated signal is sourced directly from the signal source.

26. An anterferometric signal processing apparatus as set forth in claim 22 wherein said mixer includes first and second double balanced mixers.

27. An interferometic signal processing apparatus as set forth in claim 26 wherein said first double balanced mixer is arranged in phase sensitive mode.

28. An interferometric signal processing apparatus as set forth in claim 26 wherein said second double balanced mixer is arranged in an amplitude sensitive mode.

29. An interferometric signal processing apparatus as set forth in claim 22 wherein said carrier suppressor includes a power combiner electrically connected to said first and second arms for producing the carrier-suppressed signal.

30. An interferometric signal processing apparatus as set forth in claim 22 wherein said carrier suppressor also includes a phase shifter electrically connected to said second arm between said first and second ends.

31. Am interferometric signal processing apparatus as set forth in claim 30 wherein said carrier suppressor further includes an attenuator electrically connected to said second arm between said first and second ends and in series with said phase stifter.

32. An interferometric signal processing apparatus as set forth in claim 31, wherein said mixer includes first and second double balanced mixes and said interferometric signal apparatus further comprises a second feed back control system responsive to said output signal from respective said double balanced mixers to control operation of said phase shifter and said attenuator to maximize carrier suppression.

33. An interferometric signal processing apparatus as set forth in claim 22 wherein said differential group delay between said first and second arms is less than or equal to $100/f_o$ seconds.

34. An interferometric signal processing apparatus as set forth in claim 22, wherein the differential group delay is less than or equal to $10/f_o$ seconds.

35. An interferometric signal processing apparatus as set forth in claim 22, further comprising a feed back control system responsive to said output signal to reduce one or both of the amplitude and phase noise in the device-under-test.

36. An interferometic signal processing apparatus as set forth in claim 35, wherein said feed back control system includes a voltage-controlled attenuator provided in said first arm of the bridge, and a first filter circuit responsive to said output signal to control said voltage-controlled attenuator.

37. An interferometric signal processing apparatus as set forth in claim 35, wherein said feed back control system includes a voltage-controlled phase shifter provided in said first arm of the bridge, and a second filter circuit responsive to said output signal to control said voltage-controlled phase shifter.

38. An interferometric signal processing apparatus as set forth in claim 35, wherein said device-under-test is an amplifier and a coupler is connected to the output thereof in said first arm to couple a portion of the output of the amplifier from said bridge.

39. An interferometric signal processing apparatus as set forth in claim 38, wherein a loop oscillator is connected between the output of said coupler and said first ends of said bridge to provide the input signals to said bridge.

40. An interferometric signal processing apparatus as set forth in claim 39, wherein said loop oscillator comprises: a resonant cavity connected to the output of said coupler so that said portion is input to said resonant cavity; and a phase shifter connected between the output of said resonant cavity and said first ends to provide the signal source to said bridge.

41. An interferometric signal processing apparatus as set forth in claim 40, wherein a further coupler is provided in said loop oscillator to couple a portion of the output therefrom.

* * * * *

UNITED STATES PATENT AND TRADEMARK OFFICE
CERTIFICATE OF CORRECTION

PATENT NO. : 6,753,690 B2
DATED : June 22, 2004
INVENTOR(S) : Ivanov et al.

It is certified that error appears in the above-identified patent and that said Letters Patent is hereby corrected as shown below:

Column 9,
Line 4, delete "shiftier" and insert therefor -- shifter --.
Line 27, delete "attplitude-sensitive" and insert therefor -- amplitude-sensitive --.
Line 53, delete "suppresser" and insert therefor -- suppressor --.

Column 10,
Line 50, after "cavity", insert therefor -- ; --.
Line 54, delete "claim 10" and insert therefor -- claim 20 --.

Column 11,
Line 49, delete "Am" and insert therefor -- An --.

Column 12,
Line 3, delete "stifter" and insert therefor -- shifter --.
Line 5, delete "mixes" and insert therefor -- mixers --.

Signed and Sealed this

Fourth Day of January, 2005

JON W. DUDAS
*Director of the United States Patent and Trademark Office*